(12) United States Patent
Ogawa

(10) Patent No.: US 7,920,435 B2
(45) Date of Patent: Apr. 5, 2011

(54) SEMICONDUCTOR MEMORY DEVICE

(75) Inventor: Mikio Ogawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 261 days.

(21) Appl. No.: 12/188,637

(22) Filed: Aug. 8, 2008

(65) Prior Publication Data

US 2009/0040835 A1      Feb. 12, 2009

(30) Foreign Application Priority Data

Aug. 10, 2007   (JP) ................... 2007-208719

(51) Int. Cl.
*G11C 7/00* (2006.01)
(52) U.S. Cl. ............... 365/205; 365/185.21; 365/185.18
(58) Field of Classification Search .................. 365/205, 365/185.21, 185.18, 189.05, 207, 226, 203, 365/189.06, 185.17, 185.33, 194, 210, 230.08
See application file for complete search history.

(56) References Cited

U.S. PATENT DOCUMENTS

| | | | |
|---|---|---|---|
| 5,268,867 A | 12/1993 | Momodomi et al. | |
| 5,745,678 A * | 4/1998 | Herzberg et al. | ............... 726/32 |
| 6,504,761 B2 | 1/2003 | Kai et al. | |
| 2003/0026145 A1* | 2/2003 | Lee | .............................. 365/200 |
| 2006/0034140 A1 | 2/2006 | Ogawa et al. | |
| 2007/0133297 A1* | 6/2007 | Cernea | ..................... 365/185.22 |
| 2007/0280031 A1* | 12/2007 | Maejima et al. | ......... 365/230.06 |
| 2008/0158957 A1 | 7/2008 | Ogawa et al. | |

\* cited by examiner

*Primary Examiner* — Dang T Nguyen
(74) *Attorney, Agent, or Firm* — Oblon, Spivak, McClelland, Maier & Neustadt, L.L.P.

(57) ABSTRACT

A semiconductor memory device comprises a plurality of memory cells connected to a bit line, and a sense amplifier of the current sense type. The sense amplifier includes an initial charging circuit capable of initially charging the bit line with a suppressed value of current only for a certain starting period during an initial charging period. The sense amplifier detects a value of current flowing in the bit line to decide data read out of each of the memory cells.

15 Claims, 5 Drawing Sheets

SEMICONDUCTOR MEMORY DEVICE

CROSS-REFERENCE TO RELATED APPLICATION

This application is based upon and claims the benefit of priority from the prior Japanese Patent Application No. 2007-208719, filed on Aug. 10, 2007, the entire contents of which are incorporated herein by reference.

BACKGROUND OF THE INVENTION

1. Field of the Invention

The present invention relates to a semiconductor memory device such as EEPROMs of the NAND-cell, NOR-cell, DINOR (Divided bit line NOR)-cell and AND-cell types, and more particularly to a semiconductor memory device having an improved sense amplifier of the current sense type.

2. Description of the Related Art

A sense amplifier in a semiconductor memory device such as a flash memory basically senses the presence/absence or the level of cell current flowing in accordance with data in a memory cell, thereby deciding the value of data. The sense amplifier is usually connected to a bit line (data line) to which a number of memory cells are connected. The sensing scheme is roughly divided into the voltage sense type and the current sense type.

A sense amplifier of the current sense type precharges a bit line isolated from the memory cells to a certain voltage, discharges the bit line through the selected memory cell, and detects the discharged state of the bit line at a sense node connected to the bit line. At the time of data sensing, the bit line is isolated from the current source load to detect the bit line voltage determined from cell data.

A sense amplifier of the voltage sense type, on the other hand, supplies read current flowing in a memory cell via the bit line, thereby sensing data. Also in this case, cell data determines the bit line voltage, and eventually data determination at the sense node connected to the bit line detects a difference in voltage at the sense node based on the difference in cell current.

The sense amplifier of the current sense type and the sense amplifier of the voltage sense type have the following advantages and disadvantages in general. The voltage sense type utilizes charging and discharging bit lines and accordingly has less power consumption. In a mass storage memory with a large bit line capacity, though, charging/discharging is time-consuming and accordingly fast sensing becomes difficult. In addition, the amplitude of the bit line voltage is made relatively large in accordance with cell data and accordingly a noise between adjacent bit lines causes a problem.

In contrast, the sense amplifier of the current sense type senses data while supplying read current flowing in the memory cell via the bit line, thereby enabling fast sensing. In addition, a clamp transistor (presense amplifier) arranged between the bit line and the sense node is used to reduce the amplitude of the bit line voltage in accordance with cell data and accordingly the noise between bit lines hardly causes a problem. Also in this case, however, reading is executed on alternate bit lines, and other bit lines not subjected to reading are grounded and used as shields to exclude influences between bit lines on reading.

To the contrary, the bit line potential may be controlled such that it is always fixed at a constant voltage to exclude influences between bit lines and allow all bit lines to be sensed in parallel on sensing. Such a sense amplifier of the ABL (All Bit Line) type has been proposed (JP 2006-500729T, paragraphs 0076-0079, FIG. 13).

In such the sense amplifier of the current sense type, however, the power consumption becomes larger than the sense amplifier of the voltage sense type by the extent of the current flowing while sensing. In recent, years, advanced fine patterning of devices results in a larger bit line capacity, and accordingly charging the bit line consumes a larger amount of current as a problem. The voltage sense type can restrict the current with the current control circuit on charging the bit line. In contrast, if the current sense type uses a power source restricted by the current control circuit, a bit line current can not be determined from the threshold of a cell transistor when current flows in all bit lines. In this case, the bit line current can be determined from the load in the current control, circuit, resulting in failed sensing. Therefore, the sense amplifier of the current sense type requires direct connection of the power source not via the current control circuit and allows a larger amount of current to flow on charging the bit line as a problem. In particular, the beginning of initial charging immediately after the initial charging circuit in the sense amplifier is connected to the bit line allows an excessive initial current to flow.

SUMMARY OF THE INVENTION

In one aspect the present invention provides a semiconductor memory device, comprising: a plurality of memory cells connected to a bit line; and a sense amplifier of the current sense type including an initial charging circuit capable of initially charging the bit line with a suppressed value of current only for a certain starting period during an initial charging period, the sense amplifier operative to detect a value of current flowing in the bit line to decide data read out of each of the memory cells.

In one aspect the present invention provides a semiconductor memory device, comprising: a plurality of memory cells connected to a bit line; and a sense amplifier of the current sense type operative to initially charge the bit line and then detect a value of current flowing in the bit line to decide data read out of each of the memory cells, the sense amplifier including a current control circuit connected to the power source and operative to provide a restricted current, a first circuit operative to selectively supply the current restricted by the current control circuit to the bit line only for a certain starting period of initial charging of the bit line, and a second circuit operative to selectively supply the current directly from the power source to the bit line for a period subsequent to the certain starting period of the initial charging.

In one aspect the present invention provides a semiconductor memory device, comprising: a plurality of memory cells connected to a bit line; and a sense amplifier of the current sense type operative to initially charge the bit line and then detect a value of current flowing in the bit line to decide data readout of each of the memory cells, the sense amplifier including a power circuit connected to the power source and operative to provide a low supply voltage lower than the supply voltage only for a certain starting period of initial charging of the bit line and provide the supply voltage for a period subsequent to the certain starting period of initial charging.

DETAILED DESCRIPTION OF THE EMBODIMENTS

The embodiments of the present invention will now be described below with reference to the drawings.

First Embodiment

Figure 1:
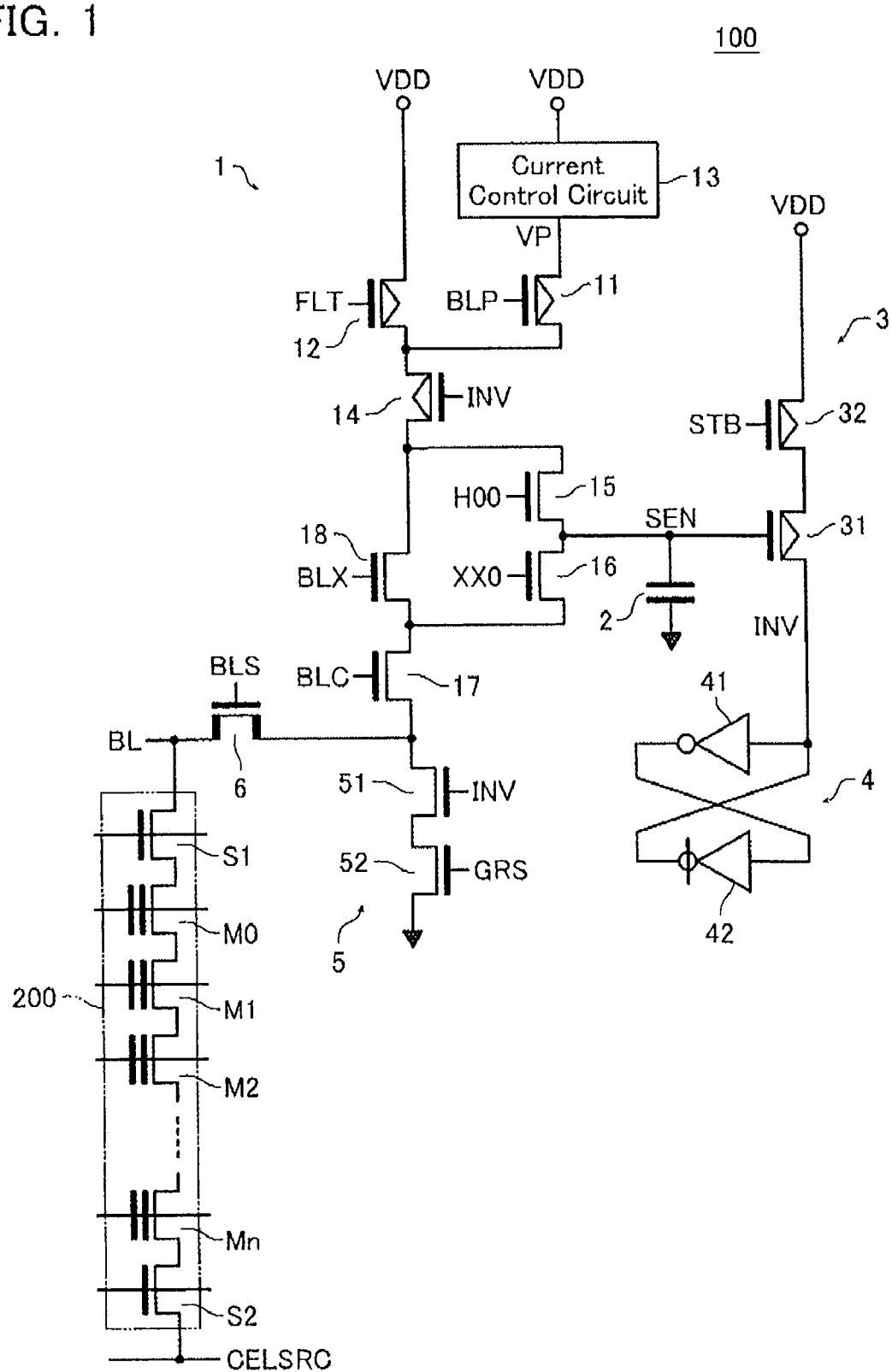
FIG. 1 is a circuit diagram of the major part of a sense amplifier in a NAND-type flash memory according to a first embodiment of the present invention.

FIG. 1 is a circuit diagram showing the major part of a sense amplifier 100 according to a first embodiment of the present invention. The sense amplifier 100 is a sense amplifier of the ABL type, which may be used as a read circuit in a NAND-type flash memory.

A bit line BL is connected to plural NAND cell units 200. A NAND cell unit 200 includes: a memory cell string of plural memory cells M1-Mn serially connected in such a manner that adjacent ones share a source/drain diffused layer; a selection gate transistor S1 connected between one end of the memory cell string and the bit line BL; and a selection gate transistor S2 connected between the other end of the memory cell string and a source line CELSRC.

The sense amplifier 100 mainly includes: an initial charging circuit 1 capable of initially charging the bit line BL and a sense node SEN; a sensing capacitor 2 connected to the sense node SEN; a current discriminating circuit 3 operative to detect the value of current flowing in the bit line BL based on the potential on the sense node SEN; a latch 4 operative to hold an output from the current discriminating circuit 3 as read data; a discharging circuit 5 operative to discharge the charge stored on the bit line BL and the sense node SEN; and a bit line selection transistor 6 operative to selectively connect the sense amplifier 100 with the bit line BL.

The initial charging circuit 1 includes charge switch transistors connected to the power source VDD to switch on/off the charging current, in this example, two PMOS transistors 11, 12 arranged in parallel. The source of the PMOS transistor 12 is directly connected to the power source VDD. In contrast, a current control circuit 13 for restricting the output current is connected between the source of the PMOS transistor 11 and the power source VDD.

Figure 2:
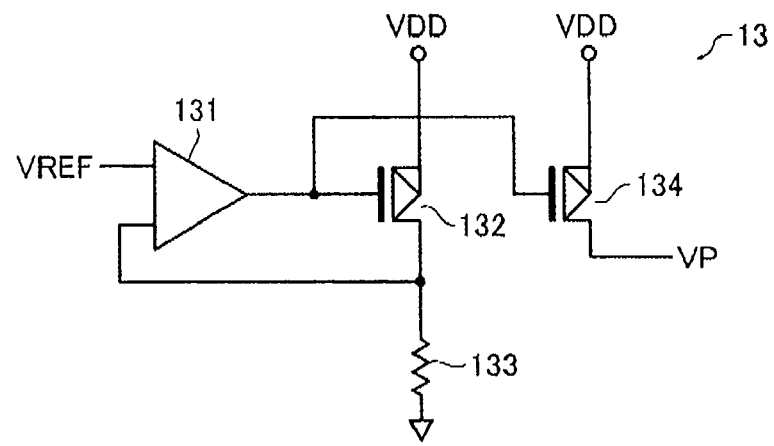
FIG. 2 is a circuit diagram showing a specific example of a current control circuit in the same sense amplifier.

The current control circuit 13 is used to restrict the output current and may be configured of a current mirror circuit as shown in FIG. 2. Namely, there is provided a serial circuit of a PMOS transistor 132 and a resistor 133, and the voltage drop in the resistor 133 is fed back to an operational amplifier 131 together with a reference voltage VREF. In this case, such a constant current flows in a PMOS transistor 134 that equalizes both input voltages.

The configuration of the current control circuit 13 is described in detail as follows. Namely, the PMOS transistor 132 has one end given the supply voltage VDD. The resistor 133 is connected to the other end of the PMOS transistor 132. The PMOS transistor 134 has one end given the supply voltage VDD and the other end that provides a restricted current. The PMOS transistor 134 is paired with the PMOS transistor 132 to configure a current mirror. The operational amplifier 131 has one input terminal connected to a point of connection between the PMOS transistor 132 and the resistor 133, and the other input terminal given the reference voltage VREF. The operational amplifier 131 has an output terminal connected to the gates of the PMOS transistors 132, 134.

The transistors 11, 12 have respective sources commonly connected. A PMOS transistor 14 and an NMOS transistor 15 are connected serially between the above commonly connected end and the sense node SEN. A serial circuit of an NMOS transistor 16 and an NMOS transistor 17 for voltage clamp is interposed between the sense node SEN and the bit line selection transistor 5. An NMOS transistor 18 is connected in parallel with the serial circuit of the NMOS transistors 15, 16. Namely, the NMOS transistor 15 supplies initial charging current to the sense node SEN. The NMOS transistor 16 supplies current from the sense node SEN to the bit line BL. The NMOS transistor 18 continuously supplies current to the bit line BL not via the sense node SEN. The NMOS transistor 17 is connected between the NMOS transistors 16, 18 and the bit line BL and used in voltage clamping. The NMOS transistors 15, 16, 18 switch the charging/discharging paths to the bit line BL and the sense node SEN. When the current discriminating circuit 3 detects the potential on the sense node SEN, the NMOS transistor 15 is turned "off" and the NMOS transistor 18 is turned "on".

The current discriminating circuit 3 includes a PMOS transistor 31 for detecting the sense node SEN, and a PMOS transistor 32 connected between the source of the transistor 31 and the power source VDD and operative at latch timing. Connected to the drain of the PMOS transistor 31 is the latch 4, which includes CMOS inverters 41, 42 connected in antiparallel. The latch 4 has an output linked to a read bus, not shown. The discharging circuit 5 includes a serial circuit of NMOS transistors 51, 52.

Figure 3:
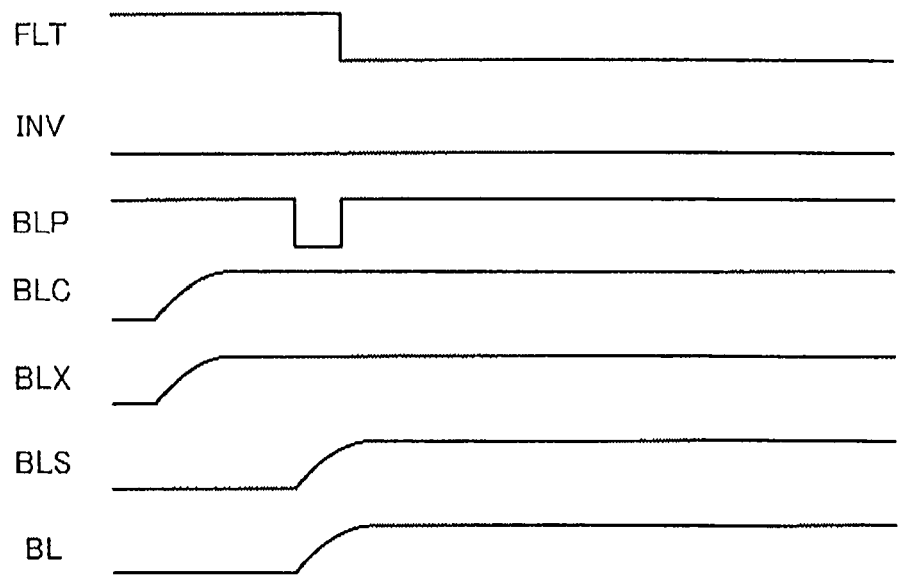
FIG. 3 is a timing chart illustrative of operation of the same sense amplifier on precharging.

The following description is given to operation of the sense amplifier thus configured according to the present embodiment. FIG. 3 is a timing chart of the sense amplifier during a precharge period.

To start precharging, first, a control signal INV supplied to the gate of the PMOS transistor 14 is at the low level, and control signals H00, XX0 supplied to the gates of the NMOS transistors 15, 16 are at the high level (not shown). In this situation, control signals BLC, BLX supplied to the gates of the NMOS transistors 17, 18 rise to a certain voltage that can transfer the power source VDD to the bit line BL. Subsequently, a control signal BLS supplied to the gate of the bit line selection transistor 6 rises and a control signal BLP fed to the gate of the PMOS transistor 11 falls only for a certain period. As a result, the transistors 11, 14, 15-18 and 6 turn on and allow charging current to flow in the bit line BL and the sense node SEN via two paths of the transistors 15, 16 and the transistor 18. This charging path includes the current control circuit 13 and accordingly can suppress large current flowing instantaneously at the initial stage of charging. Once the initial current flows, the control signal BLP rises and the control signal FLP falls instead. Accordingly, the charging path is now directly connected to the power source VDD not via the current control circuit 13. As a result, the current flowing in the bit line BL is determined from the threshold of the selected cell transistor and accordingly not sensed erroneously.

This embodiment makes it possible to prevent an excessive initial current from flowing during a period with the highest current at the beginning of charging the bit line.

After completion of the precharge period, subsequent operations are similar to those in the conventional system. Namely, the transistor 15 is turned off and the charge stored on the sense node SEN is discharged via the bit line BL and the selected cell if the selected cell holds data "1". Subsequently, the value of current flowing in the bit line BL via the transistor 18 is controlled. As a result, the bit line BL is kept always at a constant potential to exclude influences to adjacent bit lines. Thereafter, the potential on the sense node SEN is sensed to decide data stored in the selected cell. The decided data is latched in the latch 4 and provided to external via the data line. Subsequently, the charge on the bit line BL and the sense node SEN is discharged via the discharging circuit 5.

Second Embodiment

Figure 4:
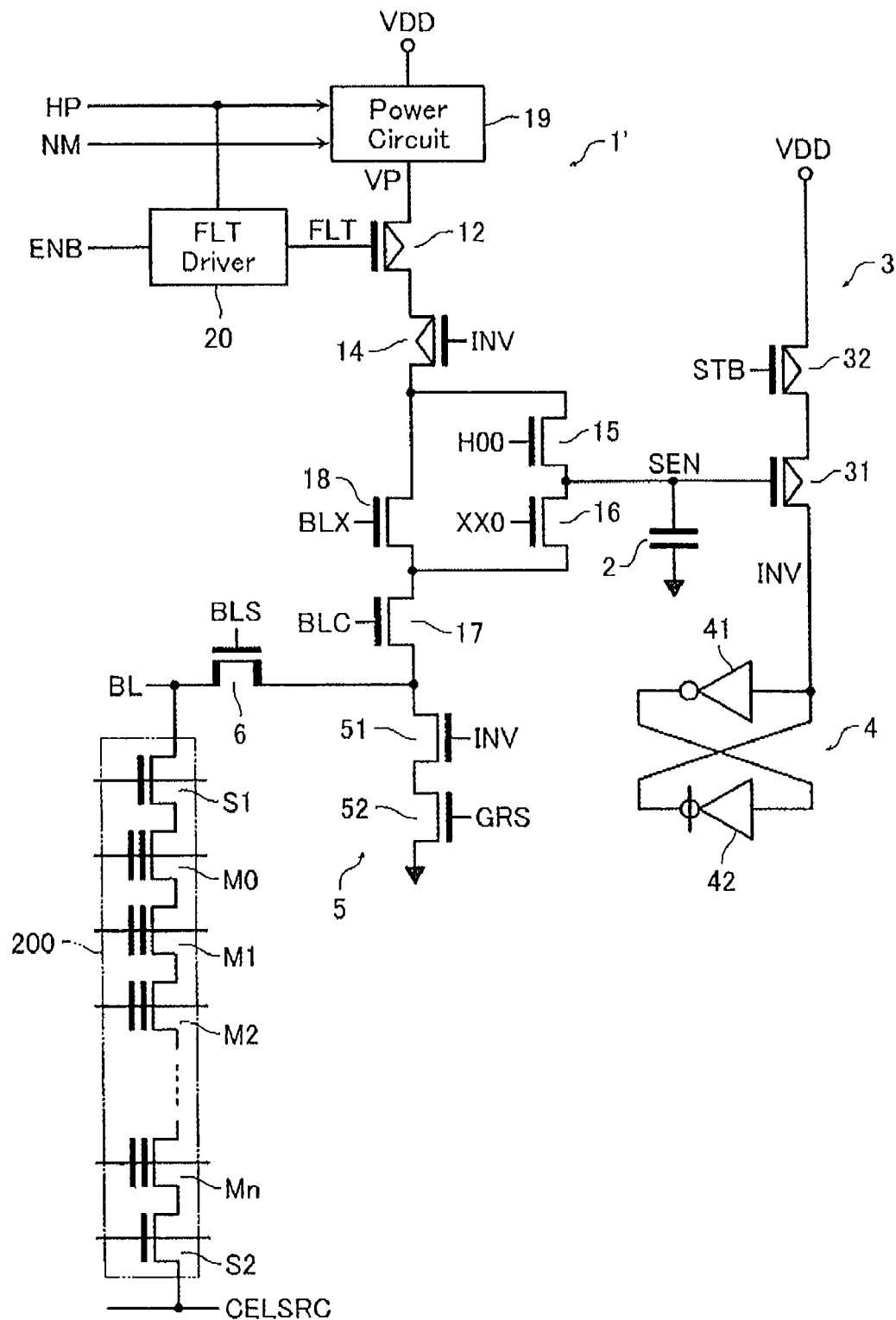
FIG. 4 is a circuit diagram of the major part of a sense amplifier in a NAND-type flash memory according to a second embodiment of the present invention.

FIG. 4 is a circuit diagram showing the major part of a sense amplifier according to a second embodiment of the present invention. This sense amplifier differs from the preceding embodiment in configuration with respect to an initial charging circuit 1'. In this embodiment, the current control circuit 13 and the PMOS transistor 11 are not arranged. Instead, in the initial charging circuit 1', the charge switch PMOS transistor 12 is not connected to the power source VDD directly but connected to the power source VDD via a power circuit 19.

Figure 5:
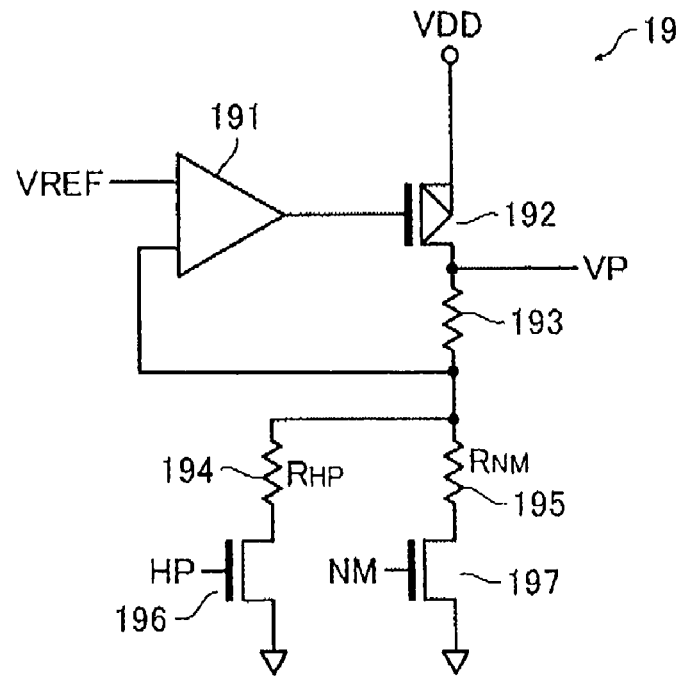
FIG. 5 is a circuit diagram showing a specific example of a power circuit in the same sense amplifier.

The power circuit 19 provides a supply voltage VDDL slightly lower than the normal supply voltage VDD as an output voltage Vp only for a certain starting period during the precharge period. The power circuit 19 may be configured as shown in FIG. 5. Namely, a PMOS transistor 192 and a resistor 193 form a serial circuit, which is serially connected to a parallel circuit of a resistor 194 and a resistor 195. The PMOS transistor 192 has one end given the supply voltage VDD, the other end used as the output terminal of the supply voltage VDD, and a gate supplied with a control voltage for constant current control. The resistors 194, 195 have respective resistances RHP, RNM, which are set as RHP<RNM. The resistors 194, 195 are serially connected to NMOS transistors 196, 197, respectively. These transistors 196, 197 are selectively turned on by respective control signals HP, NM. An operational amplifier 191 is provided, which has one input terminal connected to a point of connection between the resistor 194 and the resistor 195, the other input terminal given the reference voltage VREF, and an output terminal connected to the gate of the PMOS transistor 192. The operational amplifier 191 controls current flowing in the transistor 192 such that the voltage drop across either of the resistors 194, 195 equals to the reference voltage VREF. Accordingly, a lower output voltage VP can be obtained when the transistor 197 turns on (current flows in the resistor 195) than when the transistor 196 turns on (current flows in the resistor 194). Only for a certain starting period during the initial charging period, the NMOS transistor 196 turns "off" and the NMOS transistor 197 turns "on". For a period subsequent to the certain starting period during the initial charging period of charging the bit line BL, the NMOS transistor 196 turns "on" and the NMOS transistor 197 turns "off".

Figure 6:
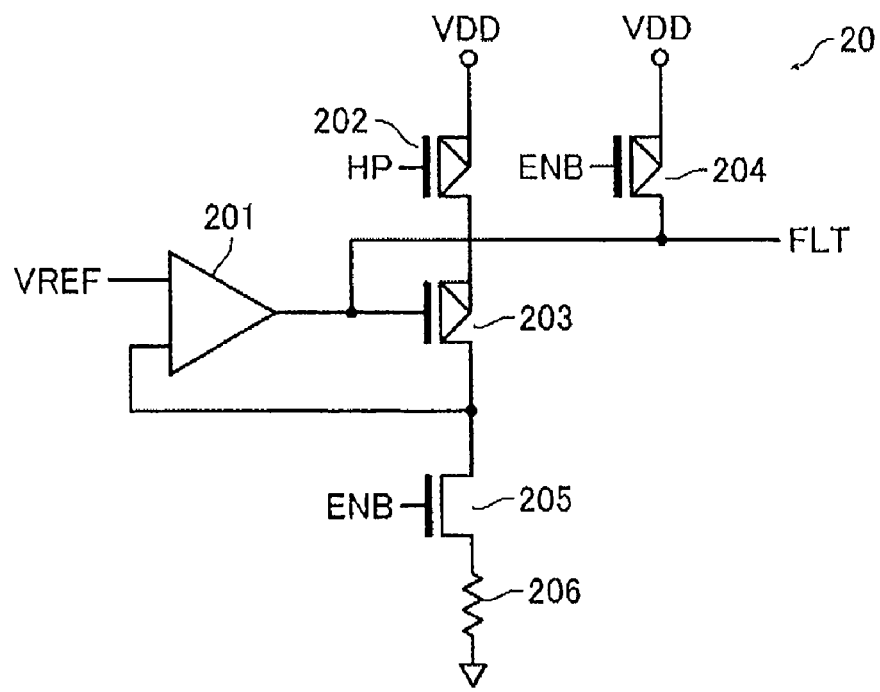
FIG. 6 is a circuit diagram showing a specific example of an FLT driver in the same sense amplifier.

This embodiment is provided with an FLT driver 20 operative to control a control signal FLT fed to the gate of the PMOS transistor 12. The FLT driver 20 provides an intermediate potential between the high and low levels only for the certain starting period during the precharge period. FIG. 6 shows a configuration example of the FLT driver 20. PMOS transistors 202, 203, an NMOS transistor 205 and a resistor 206 are serially connected, and a point of connection between the transistors 203, 205 is fed back as one input to an operational amplifier 201. The other input of the operational amplifier 201 is given the reference voltage VREF. The output from the operational amplifier 201 is used in controlling the gate of the PMOS transistor 203 and provided as the control signal FLT. The wiring for providing the control signal FLT is connected to one end of a PMOS transistor 204.

In other words, the FLT driver 20 is configured such that the operational amplifier 201, the PMOS transistor 203 and the resistor 206 serve as a constant voltage circuit that provides an intermediate voltage between the supply voltage VDD and the ground voltage to the output terminal. The PMOS transistor 204 serves as a pull-up transistor connected to the output terminal of the constant voltage circuit. The PMOS transistor 202 and the NMOS transistor 205 serve as transistors that selectively activate the constant voltage circuit.

In the FLT driver 20 thus configured, when a control signal ENB is at the low level, the PMOS transistor 204 turns on and the NMOS transistor 205 turns off, thereby turning the control signal FLT to the high level. On the other hand, when the control signal ENB is turned to the high level, the PMOS transistor 204 turns off and the NMOS transistor 205 turns on, thereby turning the control signal FLT to the low level. In this case, if a control signal HP is at the low level, the PMOS transistor 202 also turns on. Accordingly, current flows in the serial circuit including the PMOS transistors 202, 203, the NMOS transistor 205 and the resistor 206, and the value of the current can be regulated constant by controlling the transistor 203 from the operational amplifier 201. The output from the operational amplifier 201 at this time is an intermediate voltage determined from the resistances of the transistors 202, 203, 205 and the resistor 206 between the high and low levels. This voltage is provided as the control signal FLT. For the certain starting period during the initial charging period of charging the bit line BL, the PMOS transistor 204 turns "off" and the NMOS transistor 205 turns "on". For a period subsequent to the starting period of initial charging, the PMOS transistor 204 turns "on" and the NMOS transistor 205 turns "off".

Figure 7:
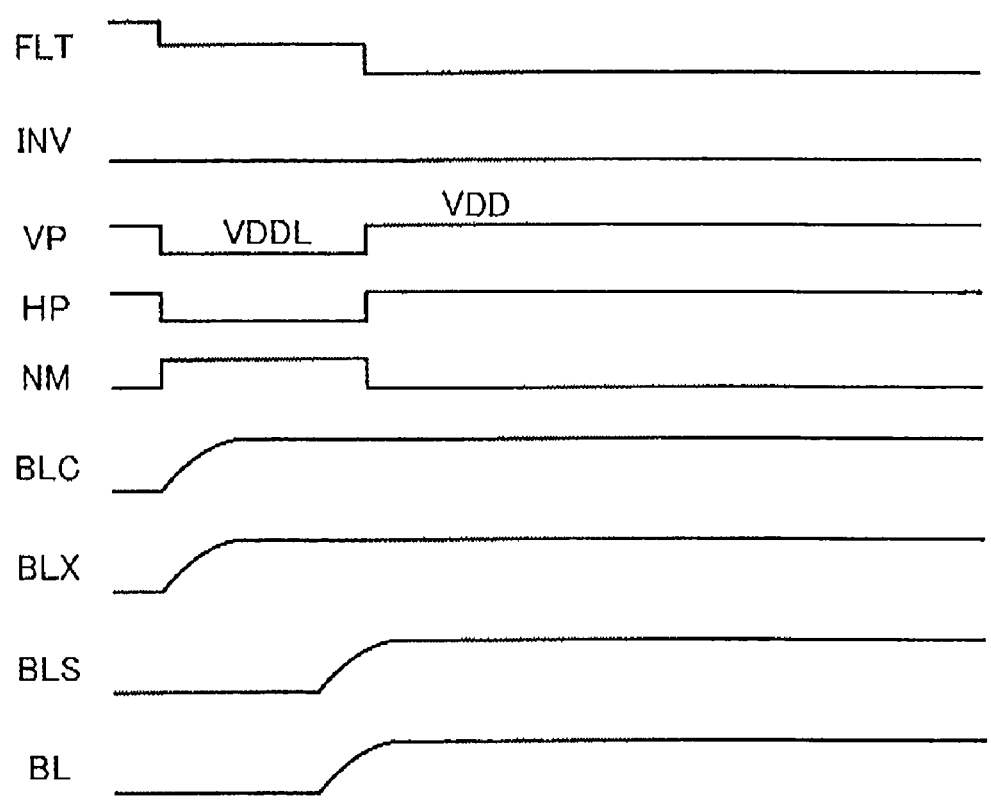
FIG. 7 is a timing chart illustrative of operation of the same sense amplifier on precharging.

The following description is given to operation of the sense amplifier thus configured according to the present embodiment. FIG. 7 is a timing chart of the sense amplifier during a precharge period.

To start precharging, first, a control signal INV supplied to the gate of the PMOS transistor 14 is at the low level, and control signals H00, XX0 supplied to the gates of the NMOS transistors 15, 16 are at the high level (not shown). In this situation, control signals BLC, BLX supplied to the gates of the NMOS transistors 17, 18 rise to a certain voltage that can transfer the power source VDD to the bit line BL. Simultaneously, the control signals HP and NM turn to the low level and the high level, respectively, thereby supplying the low supply voltage VDDL to the initial charging circuit 1' and an intermediate voltage as the control signal FLT to the gate of the PMOS transistor 12.

Subsequently, the control signal BLS supplied to the gate of the bit line selection transistor 6 rises. As a result, the transistors 12, 14, 15-18 and 6 turn on and allow charging current to flow in the bit line BL and the sense node SEN via two paths of the transistors 15, 16 and the transistor 18. The supply voltage VP is suppressed at the lower voltage VDDL and the control signal FLT to the transistor 12 is the intermediate voltage. Accordingly, large current flowing instantaneously at the initial stage of charging can be suppressed. Once the initial current flows, the control signals HP and NM turn to the high level and the low level, respectively. Accordingly, the low supply voltage VDDL returns to the normal supply voltage VDD and the control signal FLT to the transistor 12 falls to the low level. As a result, the current flowing in the bit line BL is determined from the threshold of the selected cell transistor and accordingly not sensed erroneously.

This embodiment, also makes it possible to prevent an excessive initial current from flowing during a period with the highest, current at the beginning of charging the bit line.

The above embodiments describe the sense amplifier in the NAND-type flash memory by way of example. The present invention is though not limited to the NAND-type flash memory but rather can be applied to semiconductor memory devices such as EEPROMs of the NOR type, the DINOR (Divided bit line NOR) type and the AND type as well.

What is claimed is:

1. A semiconductor memory device, comprising:
   a plurality of memory cells connected to a bit line; and
   a sense amplifier of current sense type including an initial charging circuit capable of initially charging said bit line with a suppressed value of current only for a certain starting period during an initial charging period, said sense amplifier operative to detect a value of current flowing in said bit line to decide data read out of each of said memory cells,
   said initial charging circuit including:
      a current control circuit connected to a power source and operative to provide a restricted current,
      a first transistor connected to the output terminal of said current control circuit and operative to supply the current output from said current control circuit to said bit line only for the certain starting period during the initial charging period of charging said bit line, and
      a second transistor connected to said power source and operative to supply current to said bit line for a period subsequent to the certain starting period during the initial charging period of charging said bit line.

2. A semiconductor memory device, comprising:
   a plurality of memory cells connected to a bit line; and
   a sense amplifier of current sense type including an initial charging circuit capable of initially charging said bit line with a suppressed value of current only for a certain starting period during an initial charging period, said sense amplifier operative to detect a value of current flowing in said bit line to decide data read out of each of said memory cells,
   said initial charging circuit including:
      a charge switch transistor connected between an initial charging path to said bit line and a power source and operative to switch on/off the charging current, and
      a control signal drive circuit operative to provide the gate of said charge switch transistor with a second control signal capable of achieving a higher on-resistance of said charge switch transistor than a first control signal only for the certain starting period during the initial charging period of charging said bit line, and said first control signal for a period subsequent to the certain starting period during the initial charging period of charging said bit line.

3. The semiconductor memory device according to claim 1, said sense amplifier including:
   an initial charging circuit operative to supply the initial charging current from the power source to said bit line and a sense node,
   a sensing capacitor connected to said sense node,
   a current discriminating circuit operative to detect the value of current flowing in said bit line based on the potential on said sense node,
   a latch operative to hold an output from said current discriminating circuit as read data,
   a discharging circuit connected to said initial charging circuit and operative to discharge the charge stored on said bit line and said sense node, and
   a bit line selection transistor operative to selectively connect a point of connection between said initial charging circuit and said discharging circuit with said bit line.

4. The semiconductor memory device according to claim 3, said initial charging circuit including:
   a third transistor operative to supply the initial charging current to said sense node,
   a fourth transistor operative to supply current from said sense node to said bit line,
   a fifth transistor for continuous current supplying operative to supply current to said bit line not via said sense node, and
   a sixth transistor for voltage clamp connected between said fourth and fifth transistors and said bit line,
   wherein said initial charging circuit turns said third transistor off and said fifth transistor on while said current discriminating circuit detects the potential on said sense node.

5. The semiconductor memory device according to claim 1, said current control circuit including:
   a third transistor having one end given a supply voltage,
   a first resistor connected to the other end of said third transistor,
   a fourth transistor paired with said first transistor to form a current mirror having one end given the supply voltage and the other end used to provide said restricted current, and
   a first operational amplifier having one input terminal connected to a point of connection between said third transistor and said first resistor, the other input terminal given a reference potential, and an output terminal connected to the gates of said third and fourth transistors.

6. The semiconductor memory device according to claim 1, said memory cells form any one of a NAND-type flash memory, a NOR-type EEPROM, a DINOR-type EEPROM and an AND-type EEPROM.

7. A semiconductor memory device, comprising:
   a plurality of memory cells connected to a bit line; and
   a sense amplifier of the current sense type operative to initially charge said bit line and then detect a value of current flowing in said bit line to decide data read out of each of said memory cells,
   said sense amplifier including:
   a current control circuit connected to a power source and operative to provide a restricted current;
   a first circuit operative to selectively supply the current restricted by said current control circuit to said bit line only for a certain starting period of initial charging of said bit line; and
   a second circuit operative to selectively supply the current directly from the power source to said bit line for a period subsequent to the certain starting period of said initial charging;
   said current control circuit including:
      a first transistor having one end given a supply voltage,
      a first resistor connected to the other end of said first transistor;
      a second transistor paired with said first transistor to form a current mirror having one end given the supply voltage and the other end used to provide said restricted current; and a first operational amplifier having one input terminal connected to a point of connection between said first transistor and said first resistor, the other input terminal given a reference potential, and an output terminal connected to the gates of said first and second transistors.

8. The semiconductor memory device according to claim 7, said sense amplifier including:
an initial charging circuit containing said current control circuit, said first circuit and said second circuit operative to supply the initial charging current from the power source to said bit line and a sense node,
a sensing capacitor connected to said sense node,
a current discriminating circuit operative to detect the value of current flowing in said bit line based on the potential on said sense node,
a latch operative to hold an output from said current discriminating circuit as read data,
a discharging circuit connected to said initial charging circuit and operative to discharge the charge stored on said bit line and said sense node, and
a bit line selection transistor operative to selectively connect a point of connection between said initial charging circuit and said discharging circuit with said bit line.

9. The semiconductor memory device according to claim 8, said initial charging circuit including:
a third transistor operative to supply the initial charging current to said sense node,
a fourth transistor operative to supply current from said sense node to said bit line,
a fifth transistor for continuous current supplying operative to supply current to said bit line not via said sense node, and
a sixth transistor for voltage clamp connected between said fourth and fifth transistors and said bit line,
wherein said initial charging circuit turns said third transistor off and said fifth transistor on while said current discriminating circuit detects the potential on said sense node.

10. The semiconductor memory device according to claim 2, said sense amplifier including:
an initial charging circuit operative to supply the initial charging current from the power source to said bit line and a sense node,
a sensing capacitor connected to said sense node,
a current discriminating circuit operative to detect the value of current flowing in said bit line based on the potential on said sense node,
a latch operative to hold an output from said current discriminating circuit as read data,
a discharging circuit connected to said initial charging circuit and operative to discharge the charge stored on said bit line and said sense node, and
a bit line selection transistor operative to selectively connect a point of connection between said initial charging circuit and said discharging circuit with said bit line.

11. The semiconductor memory device according to claim 10, said initial charging circuit including:
a first transistor operative to supply the initial charging current to said sense node,
a second transistor operative to supply current from said sense node to said bit line,
a third transistor for continuous current supplying operative to supply current to said bit line not via said sense node, and a fourth transistor for voltage clamp connected between said second and third transistors and said bit line,
wherein said initial charging circuit turns said first transistor off and said third transistor on while said current discriminating circuit detects the potential on said sense node.

12. The semiconductor memory device according to claim 2, said initial charging circuit including:
a power circuit connected to the power source and operative to provide a low supply voltage lower than a supply voltage only for the certain starting period during the initial charging period of charging said bit line and provide said supply voltage for a period subsequent to the certain starting period during the initial charging period of charging said bit line.

13. The semiconductor memory device according to claim 12, said power circuit including:
a first transistor having one end given the supply voltage, the other end used as the output terminal of the supply voltage, and a gate supplied with a control voltage for constant current control,
a first resistor connected to the output terminal of the first transistor,
a second resistor serially connected to the first transistor via said first resistor,
a third resistor connected in parallel with said second resistor and having a larger resistance than said second resistor,
a second transistor serially connected to said second resistor,
a third transistor serially connected to said third resistor, and
a first operational amplifier having one input terminal connected to a point of connection between said first resistor and said second resistor, the other input terminal given a reference potential, and an output terminal connected to the gate of said first transistor,
wherein said second transistor turns off and said third transistor turns on for the certain starting period during the initial charging period, and said second transistor turns on and said third transistor turns off for a period subsequent to the certain starting period of initial charging.

14. The semiconductor memory device according to claim 2, said control signal drive circuit including:
a constant voltage circuit operative to provide an intermediate voltage between a supply voltage and a ground voltage to an output terminal,
a first transistor for pull-up connected to the output terminal of a constant voltage circuit, and
a second transistor operative to selectively activate said constant voltage circuit,
wherein said first transistor turns off and said second transistor turns on for the certain starting period during the initial charging period, and said first transistor turns on and said second transistor turns off for a period subsequent to the certain starting period of initial charging.

15. The semiconductor memory device according to claim 2, said memory cells form any one of a NAND-type flash memory, a NOR-type EEPROM, a DINOR-type EEPROM and an AND-type EEPROM.

* * * * *